United States Patent
Kruit

(10) Patent No.: US 7,019,312 B2
(45) Date of Patent: Mar. 28, 2006

(54) ADJUSTMENT IN A MAPPER SYSTEM

(75) Inventor: Pieter Kruit, Delft (NL)

(73) Assignee: Mapper Lithography IP B.V., CJ Delft (NL)

(*) Notice: Subject to any disclaimer, the term of this patent is extended or adjusted under 35 U.S.C. 154(b) by 49 days.

(21) Appl. No.: 10/600,953

(22) Filed: Jun. 20, 2003

(65) Prior Publication Data
US 2004/0051055 A1   Mar. 18, 2004

Related U.S. Application Data

(63) Continuation-in-part of application No. 10/391,956, filed on Mar. 19, 2003, now Pat. No. 6,919,952.

(60) Provisional application No. 60/390,834, filed on Jun. 20, 2002.

(51) Int. Cl.
G21G 5/00 (2006.01)
H01L 29/06 (2006.01)

(52) U.S. Cl. .............. 250/492.2; 250/492; 250/492.22; 257/10; 430/296

(58) Field of Classification Search ............ 250/492.2, 250/492.3; 355/38; 430/296; 313/309
See application file for complete search history.

(56) References Cited

U.S. PATENT DOCUMENTS 6,014,200 A * 1/2000 Sogard et al. ............... 355/53
6,724,002 B1 * 4/2004 Mankos et al. ......... 250/492.24

FOREIGN PATENT DOCUMENTS

| EP | 0321147 | 12/1988 |
|---|---|---|
| EP | 02224322 | 9/1990 |
| EP | 0605964 | * 8/1993 |
| EP | 0605964 | 12/1993 |
| GB | 2164787 | 9/1985 |
| WO | WO 03/017317 | 2/2003 |

OTHER PUBLICATIONS

"Electron Beam Pattern Generator with Photon to Electron Image Conversion", M. Idesawa, et al, Database accession No. 3742200, XP002242067, pp. 54-58.

* cited by examiner

Primary Examiner—Nikita Wells
Assistant Examiner—James J. Leybourne
(74) Attorney, Agent, or Firm—Blakely Sokoloff Taylor & Zafman

(57) ABSTRACT

The present invention relates to a lithography system comprising:
  means for generating a plurality of light beamlets, and
  an electron source, arranged to be illuminated by said light beamlets, said electron source comprising a plurality of converter elements at an element distance from each other for converting a light beamlet impinging onto it into an electron beamlet directed towards and focussed on an object plane,
said lithography system further comprising control means for manipulating the mutual positions of the light beamlets with respect to the converter elements.

These control means can be of optical, thermal, mechanical or magnetical nature, and work on for instance the micro lens array, the converter plate, and the mask.

58 Claims, 14 Drawing Sheets

ADJUSTMENT IN A MAPPER SYSTEM

The present patent application is a Continuation-in-Part of application Ser. No. 10/391,956, filed Mar. 19, 2003 now U.S. Pat. No. 6,919,952. This application also claims the benefit of U.S. Provisional Application No. 60/390,834, filed June 20, 2002.

FIELD OF THE INVENTION

The present invention relates to a lithography system comprising:
  means for generating a plurality of light beamlets, and
  an electron source, arranged to be illuminated by said light beamlets, said electron source comprising a plurality of converter elements at an element distance from each other for converting a light beamlet impinging onto it into an electron beamlet directed towards and focussed on an object plane.

PRIOR ART

Current lithography systems are mostly all optical, deep UV systems. These systems use light in the deep UV region, i.e. up to 193 nm. Due to the fact that these systems are all optical, the resolution is diffraction limited. The resolution of these systems is about 130 nm at present.

WO 98/54620, which is incorporated herein by reference as it fully set forth, discloses a lithography system, which will be described with reference to FIGS. 1 and 2.

In the lithography system, a light source (not shown) produces a light beam 13, preferably in deep UV. The light beam 13 impinges on a micro lens array 1 having lenses 2. The micro lens array 1 divides the light beam 13 in light beamlets 12, of which only one is shown for the sake of clarity. In practice, there may be as much as $10^7$–$10^8$ light beamlets 12. The lens 2 focuses the light beamlet 12 on a mask 3 with spots of, e.g., 0.4 μm diameter. Each light beamlet 12 leaving the mask 3 passes a de-magnifier 14, which is schematically indicated by lenses 4 and 5 and an aperture 6. However, other types of demagnifiers known from the prior art may be used instead. The demagnifier 14 focuses the light beamlets 12 with a spot size of, e.g. 0.13 μm for each light beamlet 12, on a converter plate 7 having converter elements 8 of which only one is indicated. If, as disclosed by WO 98/54620, the converter plate 7 is constituted by a photo-cathode having a plurality of apertures a plurality of electron beamlets 15 (only one being shown in FIG. 1) is generated. Each electron beamlet 15 originates from one aperture and passes through focusing means, indicated schematically by a lens 9. Finally, the electron beamlets 15 impinge on the wafer 10 in wafer plane 11. If the spot size of each electron beamlet 15 is 0.1 μm (but in practise, this can even be much smaller), the lithography system is capable of writing details of 0.1 μm or smaller.

In an embodiment, described in PCT/NL00/00657, which document is incorporated herein as if fully set forth, the converter plate 7 consists of a semiconductor field emission photo-cathode array. The sensitivity of such a semiconductor field emission photo-cathode array as converter 7 for impinging UV light may be enhanced by the application of a fluorescent layer, which transforms the impinging UV light into light of a longer wavelength. The application of such a fluorescent layer is described in the international patent application PCT/NL00/00658, which document is Incorporated herein as if fully set forth.

Each converter element has an activation area on the side of the field emission array opposite to the cathodes. This activation area is much wider than the electron beamlet: usually about 2 microns wide. Each electron beamlet is projected onto a substrate, usually a semiconductor wafer.

The distance between two adjacent converter elements 8 is larger than the width of an electron beamlet resulting from a converter element. Furthermore, the width of an electron beamlet will in general be smaller than the width of a light beamlet 12. A method of transferring a pattern onto a wafer 10 is scanning the mask 3 with the light beamlets 12 and simultaneously scanning the wafer 10 with the electron beamlets 15. This can be done in the following way.

Mask 3 is moved in the direction of arrow P1 and at the same time, wafer 10 is moved in the direction of arrow P2. Suppose the details on the mask 3 are again 0.4 μm, and the spot size of each electron beamlet 15 on the wafer is 0.1 μm. If the mask 3 is thus moved 0.4 μm, the wafer must be shifted 0.1 μm in accordance with the magnification factor provided by the demagnifier 14. In an embodiment shown in FIG. 2, the converter elements 8 are arranged in lines and columns and the scanning direction SCAN differs from the direction of the lines of pixels. In that way, the entire pattern of a mask can be transferred, reduced in size, onto a wafer.

The resolution is thus enhanced by sharpening up pixel by pixel, using a photo-cathode with very many apertures. Thus, converting the light into electron beamlets and using a scanning technique can transfer the mask pattern transferred onto a wafer at a resolution smaller than the optical limit. This known technology is called "Multiple Aperture Pixel by Pixel Enhancement of Resolution" or "MAPPER" technology. It can be thought of as traditional projection lithography in which the mask information is split up and transferred to the water sequentially. It can also be thought of as multiple micro-column lithography in which the electron sources are blanked by the mask.

It is noted that in a MAPPER system of the prior art, the projection of each beamlet 12 from a respective lens 2 in the micro lens array 1 on the converter plate 7 must largely coincide with a converter element 8. The demagnifying optics 14 must thus accurately match the distance of adjacent lenses 2 in the micro lens array 1 to the distance of adjacent converter elements 8 in the converter plate 7 by applying the exact (de)magnification. However, it is not necessary to obtain a precise match of the projected lens distances and the converter element distances: It is sufficient if the light spot of a certain light beamlet reaches the sensitive area of an intended converter element. The tolerance for this is a few hundred nm. Thus, the distortion requirements of the optical system in such a MAPPER system are reduced in comparison to current all-optical systems.

Research showed, however, that in a MAPPER system the relative positions of the electron beamlets on the wafer must exactly match the relative positions of the light beamlets on the mask. The pattern of the electron beamlets should only be a demagnification factor smaller than the pattern of the light beamlets. For example, if an electron beamlet is displaced by a distance x from its ideal position, than the part of the pattern on the wafer which is written by this electron beamlet is displaced entirely by that distance x.

An obvious way of solving this problem is by producing all the elements making up the MAPPER system within narrow tolerances. This would therefore mean that the different parts have to be fabricated with $10^{-8}$ precision: the converter plate should be manufactured with a distance accuracy of 1–10 nm on the converter plate which itself has a total size of 5–50 mm and the micro lens array, which has a total size of 30–300 mm should have a distance accuracy of 5–50 nm. Furthermore, for instance the temperature has to be maintained exactly constant, the components have to be assembled absolutely stress-free and all electromagnetic fields near the electron beamlets have to be homogeneous.

A problem, which thus emerges in a MAPPER system, is that the extra components compared to known deep-UV lithographic systems were found to put a heavy burden on alignment of the different parts of the system. Furthermore, it was found that even with perfect alignment of the MAPPER system, because of tolerances between converter plates, the alignment after replacement of parts and/or of a mask would not be as perfect as it was at first. Even worse, the system would not be able to cope with slight expansion or contraction of wafers between process steps, for which the magnification between mask and wafer must be adjusted.

Recently a MAPPER system operating without a mask has been developed, which operation is disclosed in patent application PCT/NL03/00206, which is incorporated herein by reference as if fully set forth. In the maskless concept each converter element of the converter plate is activated by a corresponding light beamlet falling onto a corresponding activation area. In order to avoid cross talk (the unintended activation of a neighboring converter element), the cross section of each light beamlet should be well aligned with and well focused on an activation area. The light for activating the converter elements is preferably transported to a region close to the activation area of each converter element using optical fibers. The focusing is preferably performed using an optical assembly comprising a plurality of microlenses preferably forming a microlens array. The light is generated by a plurality of individually switchable light sources, for instance semiconductor lasers. Each optical fiber is preferably connected to a corresponding light source, and electronical or optical means are used to couple the light, generated by said light sources, into each optical fiber. The light falling on the activation area of each converter element can be switched on for instance by switching each light source on and off. The light sources or optical switches controlling the light sources are controlled using one or more computer systems. In these ways a very high data rate can be obtained, and the use of a mask to transfer a pattern onto a exposure surface of a target, most often a wafer or a mask blank, is no longer required. However, it can be easily understood that even without a mask the alignment of all other components remains extremely difficult.

For clarity the MAPPER system comprising a mask will in the rest of this application be denoted as mask-based MAPPER system and the system without a mask will be denoted as maskless MAPPER system. When both systems are addressed the term MAPPER system will be used.

SUMMARY OF THE INVENTION

It is an object of the present invention to overcome the aforementioned disadvantages of both the MAPPER mask-based and MAPPER maskless system of the prior art.

The present invention relates to a lithography system comprising:
  means for generating a plurality of light beamlets, and
  an electron source, arranged to be illuminated by said light beamlets, said electron source comprising a plurality of converter elements at an element distance from each other for converting a light beamlet impinging onto it into an electron beamlet directed towards and focussed on an object plane, said lithography system further comprising control means for matching the mutual positions of the light beamlets to the mutual positions of the electron beamlets.

Specifically, it was found that the implementation of control means for adjusting the mutual positions of the light beamlets and the electron beamlets would be possible which enable an operator to make very small adjustments, usually on the order of less than 100 nm at wafer level, with a precision better than 10 nm, preferably 1 nm, in order to restore full alignment of all the components of a MAPPER system. In for instance the MAPPER mask-based system, this means a precision on the mask of about 60 nm, preferably 6 nm.

In an embodiment of the present invention said means for generating a plurality of light beamlets comprises:
  at least one light source for generating at least one light beam;
  a micro lens array, arranged in the light path of said light source between said light source and said electron source and comprising a plurality of lenses at a lens distance from each other, said plurality of lenses being arranged for forming said plurality of light beamlets, and for focussing said focusing said plurality of light beamlets onto said electron source.

In an embodiment thereof said at least one light source for generating at least one light beam is individually controllable. Possible individually controllable light sources include (semiconductor) lasers and light emitting diodes (LEDs), preferably arranged to form an array. The light sources can be switched on and off individually and independently from each other, even independent from a neighbouring light source in an array.

Surprisingly, it was found that the projection of the beamlets could be manipulated through adjustment means, specifically adjustment means comprising thermal means, optical means or mechanical means. Using one of these means, or better yet, a combination of these means, it has proved to be possible to make a stable and operable lithography system having a resolution smaller than 100 nm, specifically smaller than 50 nm, which would be able to work and maintain its specifications under various working conditions. In fact, by providing, in an embodiment, adjustment means which actively and continuously manipulate the positions of the light beamlets, using continuously measured positional data regarding the position of one or more light beamlets which are fed to a controller via a feedback loop, a dynamically adjusted system can be realised.

In an embodiment of the invention, the control means comprise micro lens adaptive means for actively adapting the working parameters of the micro lens array, specifically the micro lens adaptive means comprise means for adapting the physical properties of the micro lens array.

In an embodiment thereof, the means for adapting the physical properties of the micro lens array comprise means for changing the lens distance. In a specific embodiment thereof, the means for changing the lens distance comprise microlens-related thermal means for changing the temperature of the microlens array. It was found that very small changes in temperature, i.e. in the order of one hundredth K, can change the lens distance in the order of one or more nanometers.

The temperature can be changed in several ways. First, the microlens-related thermal means can be adapted to change the temperature of the micro lens array uniformly. In that way, all the lens distances are changed in the same way. Alternatively, the microlens-related thermal means can be adapted to apply a temperature profile across the micro lens array. In that way, it is possible to correct distortions.

In another embodiment of the invention, the means for changing the lens distance comprise microlens-related mechanical means for applying mechanical forces to the micro lens array. Various types of forces can be thought of. In one embodiment, the microlens-related mechanical means comprise means for applying pressure forces to the micro lens array. In another embodiment, the microlens-related mechanical means comprise means for applying tensile forces to the micro lens array. In a further embodiment, the microlens-related mechanical means comprise means for applying torsion forces to the micro lens array.

The forces may be applied to the micro lens array uniformly, In that way the lens distances are modified uniformly. It is also possible to apply the forces to the micro lens array according to a predetermined profile. In that way, distortion can be compensated. Using a computerised controller, it is possible to apply a combination of pressure forces, tensile forces and torsion forces to the micro lens array. For this, an "intelligent" controller is required, with a feedback loop feeding back measurements of the positions of the light beamlets and with a memory comprising previous settings and measurements. The controller may for instance use a neural network to store the settings and measurements, and use a genetic algorithm for finding the best settings to be used.

In another embodiment of the invention, the lithography system comprises first optical means for modifying the light from the light source illuminating the micro lens array. In a first embodiment thereof, the first optical means for modifying the light from the light source comprise a lens or system of lenses, for modifying the true or virtual focal point of the light from the light source. In this embodiment, the optical means are used to change the incoming angle of the light beam from the light source. By changing the angle of the incoming light it was found out to be possible to change the position of the focal point of each light beamlet.

In another embodiment, the first optical means for modifying the light from the light source comprise liquid crystal means for adaptively modifying the phase of the light from the light source. In an embodiment thereof, the first optical means for modifying the light from the light source comprise liquid crystal means for locally, in a plane parallel to the micro lens array, adaptively modifying the phase of the light from the light source. The liquid crystal means can be a liquid crystal (LC) layer like the one used in known LCD screen, or of a kind specifically useful for deep-UV. The LC layer is placed between transparent sheets, which may be provided with a grid or array of transparent electrodes in order to change the properties of the LC layer.

The lithography system of the current invention may further comprise mask-holding means for holding a mask between the micro lens array and the electron source, wherein the control means comprise mask adaptive means for actively adapting the working parameters of the mask. In an embodiment thereof, the mask adaptive means comprise means for adapting the physical properties of the mask. Specifically, the mask adaptive means comprise mask-related thermal means for changing the temperature of the mask. Using the thermal expansion and contraction, it was found to be possible to change the position of the details on a mask, and thus align the mask (or better, the features on the mask) with regard to the other components of the lithography system.

In one embodiment, the mask-related thermal means are adapted to change the temperature of the mask uniformly. In that way, the distance between all the mask elements changes equally. In another embodiment, the mask-related thermal means are adapted to apply a temperature profile across the mask. In that way, the mutual distance between the elements on the mask change, making it possible to compensate for distortion.

In another embodiment of the invention, the mask adaptive means comprise mask-related mechanical means for applying mechanical forces to the mask. In a first embodiment, the mask-related mechanical means comprise means for applying pressure forces to the mask. In a second embodiment, the mask-related mechanical means comprise means for applying tensile forces to the mask. In a third embodiment, the mask-related mechanical means comprise means for applying torsion forces to the mask.

In one embodiment, the mask-related mechanical means comprise means for applying forces to the mask uniformly. In this way, the distance between all the mask elements or features changes uniformly. The uniform force may be applied uniformly in the mask-plane in one of the X-direction or the Y-direction defining the mask plane. In that way the distances between the elements on the mask are in the X-direction or the Y-direction modified uniformly. The uniform forces in the X-direction and the Y-direction may also be combined, to independently change distances both in the X-direction and the Y-direction.

In another embodiment, the mask-related mechanical means comprise means for applying forces to the mask according to a predetermined profile. In that way, the distances between elements on the mask are modified in a non-uniform way, making it possible to compensate for distortions.

In a further embodiment, wherein the mask-related mechanical means comprise means for applying a combination of pressure forces, tensile forces and torsion forces to the mask.

According to another aspect of the invention, the control means for manipulating the mutual positions of the light beamlets and the electron beamlets comprise converter adaptive means for actively adapting the working parameters of the converter.

In a further embodiment thereof, the converter adaptive means comprise means for adapting the physical properties of the converter. In an embodiment thereof, the means for adapting the physical properties of the converter comprise means for changing the element distance.

In one embodiment thereof, the means for changing the element distance comprise converter-related thermal means for changing the temperature of the converter. According to one aspect thereof, the converter-related thermal means are adapted to change the temperature of the converter uniformly. This makes it possible to uniformly adjust the position of the converter elements. According to another aspect thereof, the converter-related thermal means are adapted to apply a temperature profile across the converter, thus making it possible to adjust for distortions.

In another embodiment of the means for changing the element distance, the means for changing the element distance comprise converter-related mechanical means for applying mechanical forces to the converter. In one embodiment thereof, the converter-related mechanical means comprise means for applying pressure forces to the converter. In another embodiment thereof, the mechanical means comprise means for applying tensile forces to the converter. In yet another embodiment, the converter-related mechanical means comprise means for applying torsion forces to the converter.

The converter-related mechanical means might comprise means for applying forces to the converter uniformly. In that way, all the element distances are shifted uniformly. In another embodiment, however, the mechanical means comprise means for applying forces to the converter according to a predetermined profile, thus making it possible to reduce or remove distortion.

In another embodiment, the converter-related mechanical means comprises means for applying a combination of pressure forces, tensile forces and torsion forces to the converter. In that way, several types of misalignment may be reduced or compensated.

According to another aspect of the invention, the control means comprise adaptive means for substantially matching said lens distance with said element distance by either expansion or contraction of at least one of said micro lens array and said electron source. In an embodiment of this aspect, said adaptive means comprise microlens-related thermal means for modifying said lens distance by either thermal expansion or contraction of said micro lens array. In another embodiment thereof or together with the previous embodiment, said adaptive means comprise converter-related thermal means for modifying said element distance by either thermal expansion or contraction of said electron source.

In a specific embodiment, said microlens-related thermal means comprise a microlens-related thermal controller and microlens-related thermal elements. In an embodiment thereof, said microlens-related thermal elements are arranged to generate a microlens-related heat flow to or from said micro lens array. Said microlens-related thermal controller can be arranged to control said microlens-related heat flow independence of a microlens-related control signal relating to the temperature of said micro lens array. In this arrangement, a microlens-related temperature sensor for sensing the temperature of said micro lens array generates said microlens-related control signal. In the arrangement, it is possible that said microlens-related thermal controller is arranged to control said microlens-related heat flow independence of a microlens-related control signal relating to a value of a detector signal generated by a microlens-related detector for indicating the match of said lens distance and said element distance.

In another specific embodiment, or together with a previous embodiment, said converter-related thermal means comprise a converter-related thermal controller and converter-related thermal elements. In this arrangement, that said converter-related thermal elements are arranged to generate a converter-related heat flow to or from said electron source. In this arrangement, it is furthermore possible that said converter-related thermal controller is arranged to control said converter-related heat flow in dependence of a converter-related control signal relating to the temperature of said electron source. A converter-related temperature sensor for sensing the temperature of said electron source might generate said mask-related control signal. Said mask-related thermal controller may further be arranged to control said heat flow independence of a converter-related control signal relating to a value of a detector signal generated by a converter-related detector for indicating the match of said lens distance and element distance.

A lithography system according to present invention may further comprise a mask comprising an image, and said light beamlet from each of said plurality of lenses is being focused on said mask.

A lithography system according to the present invention may further comprise an optical system being arranged for projecting said image on said electron source by said light beamlets of each of said plurality of lenses.

The control means of the lithography system according to the invention may, according to another aspect of the invention, further comprise mechanical means for applying mechanical forces to at least one of said micro lens array and said electron source for expanding or contracting of one of said micro lens array and said electron source.

The optical means of the lithography system of the invention may comprise phase shift gradient means on at least one micro lens. Such phase shift gradient means may include an LC-screen placed before or after the micro lens array. The optical means may further or next to that comprise a refractive lens before the micro lens array. In that case, the refractive lens may comprise means for displacing the refractive lens along the optical axis.

In an embodiment of the lithography system according to the invention, the control means comprise:
a comparator for continuously comparing the actual positions of the light beamlets with desired positions;
a processor for calculating a target setting of the positions, based on the comparisons of the comparator;
a controlling element for adapting at least one of the working parameters of at least one of the micro lens array, the mask and the converter until the desired positions are reached. In an embodiment, the controlling element continuously adapts at least on working parameter and maintains them at that desired positions,
measure means for measuring at least one of the mutual position of light beamlets, electron beamlets and mask features.

In an embodiment of the lithography system of the current invention the control means comprise magnetic means for actively adapting the positions of electron beamlets in the object plane. The magnetic means are suited because they can be located away from the converter plate and the object plane, making it easy to install these means, for instance in addition to the other adaptive means described above. In an embodiment, the magnetic means comprise at least one magnetic field generator for modifying the magnetic field between the electron source and the object plane.

In one embodiment, the magnetic field generator is adapted for applying a non-uniform magnetic field component between the electron source and the object plane. Using the non-uniform field, and especially by varying the field and adapting it to measured positions of the electron beamlets, makes it possible to displace the electron beamlets in the object plane and to compensate for variations in the converter plate and variations as a result of changes in an object, for instance a wafer, positioned in the object plane.

In one embodiment, the non-uniform magnetic field component is a dipole or quadrupole field. In another embodiment, the magnetic field generator is adapted for applying a field strength of the magnetic field between the electron source and the object plane, increasing uniformly in at least one direction in a plane parallel to the object plane. In still another embodiment, the magnetic field generator is adapted for applying a field strength of the magnetic field between the electron source and the object plane, increasing with the distance from the optical axis of the lithography system. In another embodiment, the magnetic field generator is adapted for applying a field strength of the magnetic field between the electron source and the object plane, the radial component increasing proportional with the distance from the optical axis of the lithography system. This various embodiments of a non-uniform magnetic field can be combined. The magnetic field can also be combined with other adaptive means described above.

In a further embodiment, the magnetic field generator is adapted for applying a continuously varying magnetic field between the electron source and the object plane. Especially, it is possible to modify or vary the magnetic field as a result of measured positions of electron beamlets.

The present invention further relates to a substrate, preferably a semiconductor wafer, processed using a lithography system described above, and to a method for processing said substrate, using such a lithography system.

Advantageously, the present invention for making fine adjustments to the beamlet projection on the converter plate which can be controlled by a simple adjustment of the temperature of either the micro lens array or the converter plate, or both, of the lithography system.

Moreover, the fine adjustment according to the present invention can also be applied to correct for an imaging mismatch between the micro lens array and the converter plate, when the dimensions of the micro lens array and/or the converter plate may be changed due to a change of their respective temperature.

It was also found out that it was possible to make such small adjustments through mechanical means or through optical means or magnetical means, or a combination of these means.

BRIEF DESCRIPTION OF THE DRAWINGS

The invention will now be explained with reference to some drawings, which are only intended to illustrate the invention and not to limit its scope of protection.

DESCRIPTION OF PREFERRED EMBODIMENTS

Figure 1:
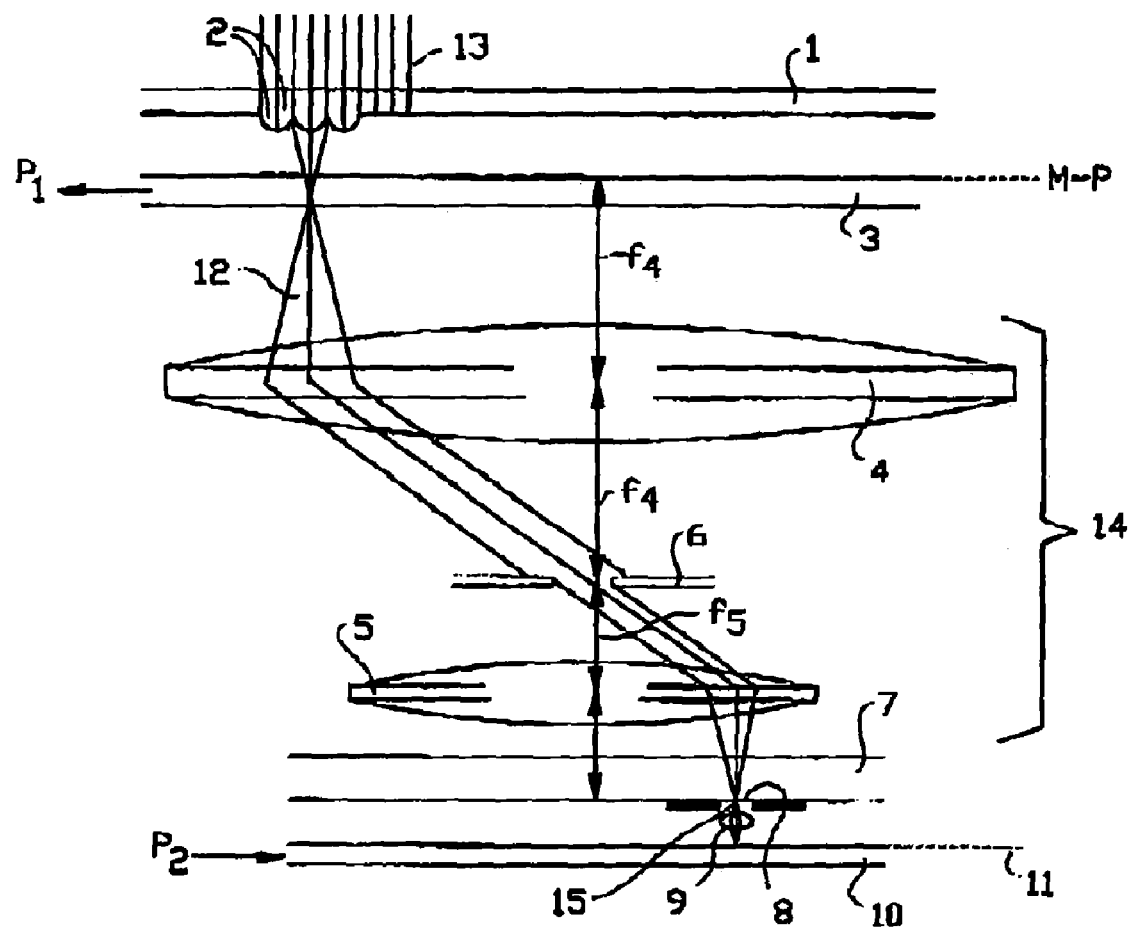
FIG. 1 shows schematically a lithography system according to the prior art.
Figure 2:
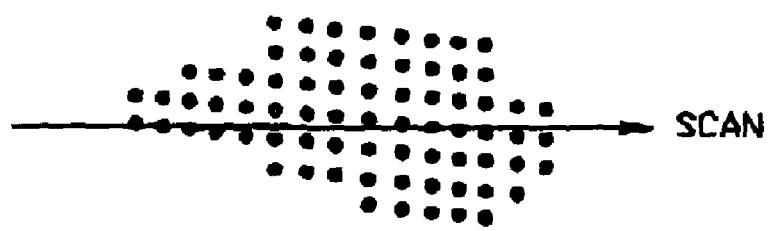
FIG. 2 shows an example of a scanning direction of pixels on a wafer to be lithographed.
Figure 14:
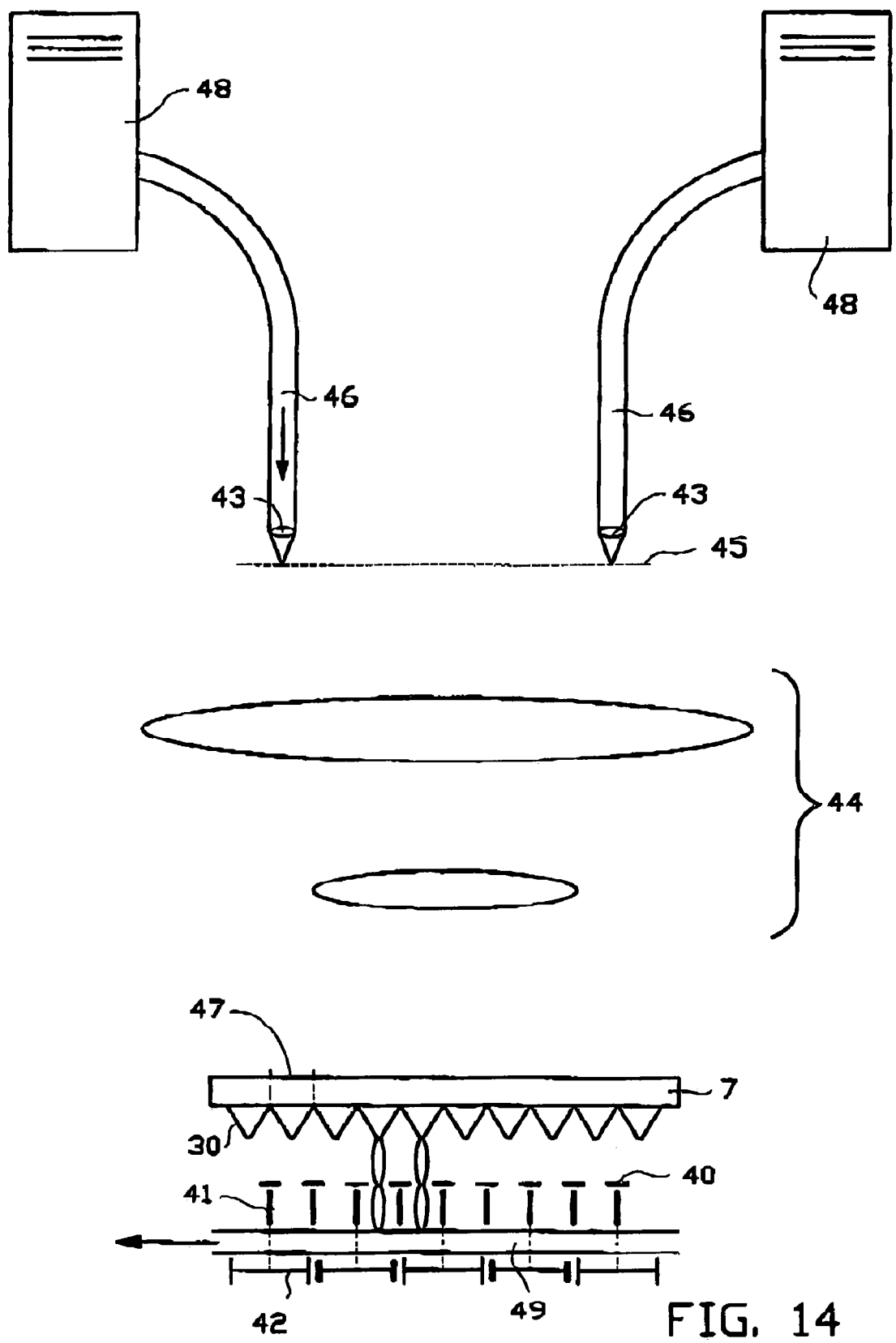
FIG. 14 shows an embodiment of the MAPPER maskless system using optical fibers and demagnifying optics.

FIGS. 1 and 2 have been explained above in relation to the discussion of the prior art. FIGS. 3–10 show a mask-based MAPPER system, however most depicted means also apply for the maskless MAPPER system. FIG. 14 exclusively shows an embodiment of the MAPPER maskless system.

In the Figures, entities with the same reference numbers as used in FIGS. 1 and 2, refer to the same entities as shown in those figures.

Figure 3:
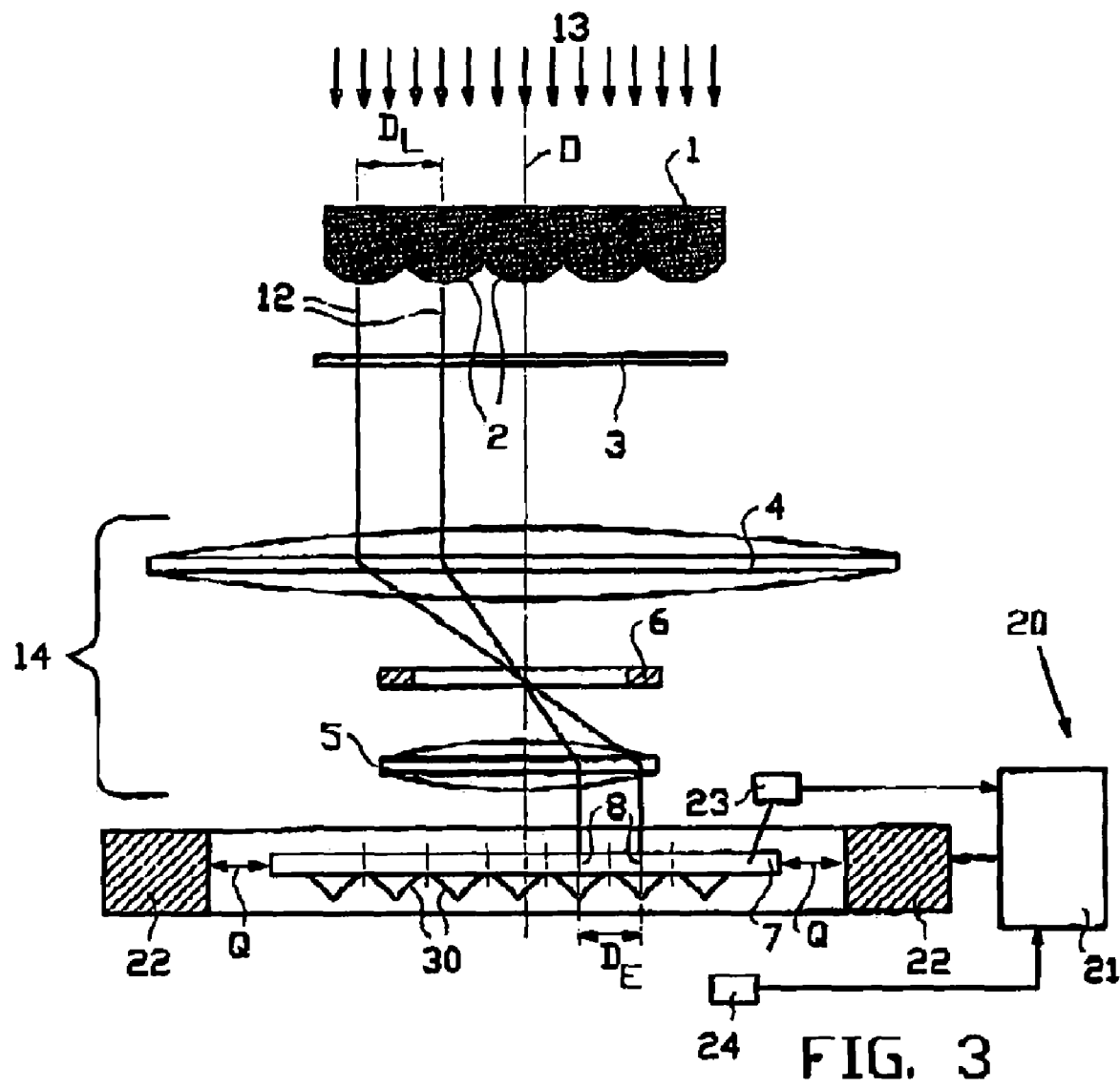
FIG. 3 shows schematically a first embodiment of a lithography system according to the present invention, which uses converter-related thermal means for adjustment of the converter plate.

FIG. 3 shows schematically a first embodiment of a lithography system according to the present invention, which uses a fine adjustment of the converter by converter-related thermal means. In the converter plate 7, as described in PCT/NL00/00657, semiconductor field emitter tips 30 are used as converter elements 8. The adjacent field emitter tips 30 are spaced apart at an element distance $D_E$, which indicates the intermediate distance between the respective centres of the adjacent converter elements 8. In the micro lens array 1 adjacent lenses 2 are located at an intermediate lens distance $D_L$, which denotes the distance between the optical axes 26 of adjacent lenses 2.

The projection of each light beamlet 12 from a respective lens 2 in the micro lens array 1 on the converter plate 7 should largely coincide with a converter element 8. The demagnifying optics 14 must match the lens distance $D_L$ of adjacent lenses 2 in the micro lens array 1 to the element distance $D_E$ of adjacent converter elements 8 in the converter plate 7 by applying the (de)magnification factor of $D_E/D_L$.

However, deviation may occur between the actual and desired value of the element distance $D_E$ of the field emitter tips 30 in the converter plate 7 and of the lens distance $D_L$ of lenses 2 in the micro lens array 1, respectively, due to e.g., variations in the manufacturing of the respective parts. It is noted that the deviations mentioned here do not only relate to an overall deviation of the repeating distance of the lenses 2 and converter elements 8, respectively, but do also relate to local variations of the intermediate distance within the lens array 1 or the converter plate 7.

The precise matching of the actual lens distance $D_L$ and the actual element distance $D_E$ is done by adaptive means 20 which are capable of modifying and controlling the dimensions of the converter plate 7 by thermal expansion/contraction. The adaptive means 20 can heat and/or cool the converter plate 7 to change the dimensions of the converter plate 7 in dependence of the thermal expansion coefficient. The element distance $D_E$ will change accordingly. The adaptive means 20 are capable of providing a uniform temperature profile, which allows a uniform expansion of the converter plate 7. On the other hand, in some cases a non-uniform, but controllable, expansion or contraction may be desired.

The adaptive means 20 comprise a thermal controller 21 and thermal elements 22. In the embodiment depicted, the thermal elements 22 are arranged at the perimeter of the converter plate 7 to avoid obstruction of the incoming light beam 13 from the light source. Heat flow Q in the horizontal direction to and from the converter plate 7, as indicated by arrows Q, is used to adjust the temperature of the plate 7. Such thermal elements 22 may comprise lamps, IR lasers, resistive elements and/or Peltier elements to generate the heat flow Q, but other types of elements may be conceivable, just like the thermal elements for the micro lens array. In one embodiment, for instance, IR light is entered into the lithography system together with the beam 13.

The thermal controller 21 is arranged to control the thermal output of the thermal elements 22 in dependence of a control signal. The control signal may relate to the temperature of the converter plate 7 or to a value of a detector signal that indicates the match of the electron beamlets on the detector 24. The temperature of the micro lens array 1 may be measured by any type of temperature measurement unit 23 known from the prior art. A detector for measuring the match of the projected electron beamlets on the detector 24 may be the same type of detectors and systems described above.

Other types of thermal control signal may be conceivable as well. The temperature changes needed for the adjustments are very small. For instance, in order to obtain a change in lens distance of 5 nm, a temperature change of about 0.01 K would be sufficient.

Figure 4:
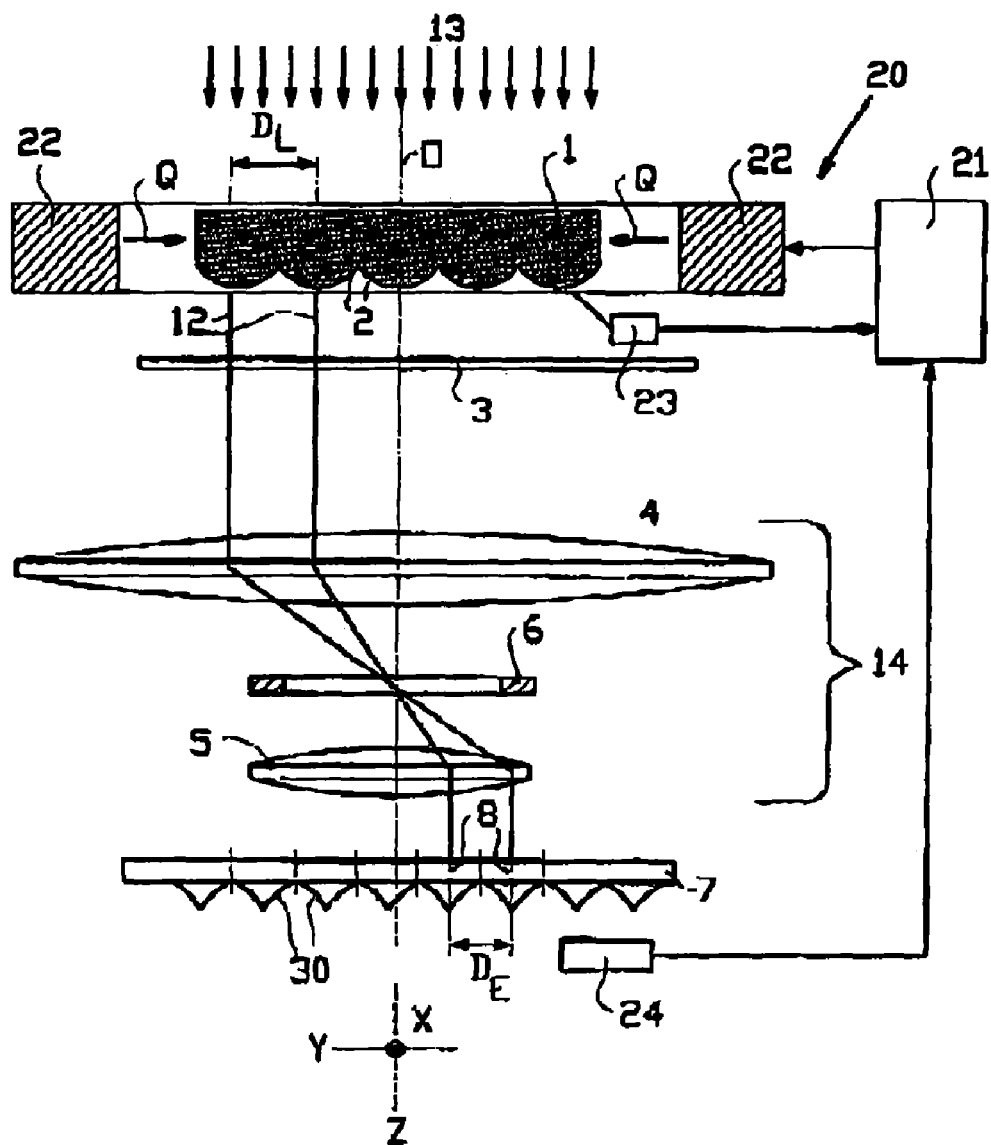
FIG. 4 shows schematically a second embodiment of a lithography system according to the present invention, which uses microlens-related thermal means for adjustment of the micro lens array.
Figure 4:
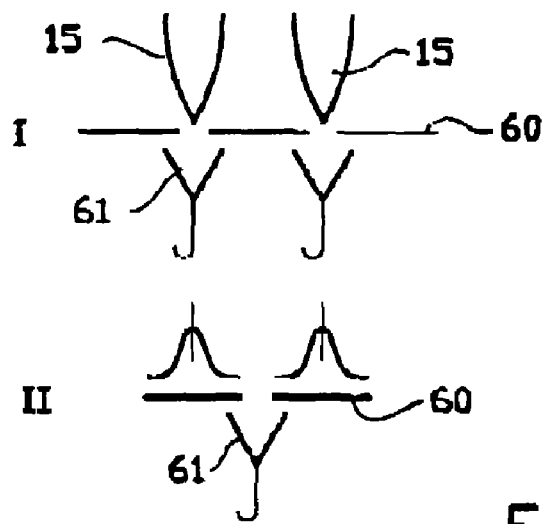

FIG. 4 shows schematically a second main embodiment of a lithography system according to the present invention, which uses a fine adjustment of lens distance $D_L$ of the micro lens array 1.

In the second main embodiment of the present invention, the matching of the actual lens distance $D_L$ and the actual element distance $D_E$ is done by adaptive means 20 which are capable of modifying and controlling the dimensions of the microlens array 1.

In an embodiment thereof, the dimensions of the micro lens array 1 are modified by thermal expansion. The adaptive means 20 can heat and/or cool the micro lens array 1 to expand or, respectively, contract the micro lens array 1. By changing the temperature of the micro lens array 1, the dimensions of the micro lens array will change in dependence of the thermal expansion coefficient and the change of the temperature. By change of the dimensions of the micro lens array 1, the lens distance $D_L$ will change accordingly. Thus, by controlling the temperature of the micro lens array 1, the lens distance $D_L$ is controlled. The adaptive means 20 are capable of providing a temperature profile, which allows a uniform expansion of the micro lens array 1.

Just like FIG. 3, the adaptive means 20 comprise a thermal controller 21 and thermal elements 22. In the embodiment depicted, the thermal elements 22 are arranged at the perimeter of the micro lens array 1 to avoid obstruction of the incoming light beam 13 from the light source. Energy transport by a heat flow Q (e.g., by radiation or by conductive transfer) in the horizontal direction to or from the micro lens array 1, as indicated by arrows Q, is used to adjust the temperature of the micro lens array 1. Instead or in addition to the thermal element depicted, such thermal elements 22 may comprise lamps, lasers, Peltier elements and/or cooling gas to generate the heat flow Q, but other types of elements may be conceivable. Using for instance IR lasers or lamps, it is possible to heat the entire surface of the micro lens array, even by illumination through some of the other elements in the lithography system, like the mask. Another option may be a grid of conductive lines on the surface of the micro lens array.

The thermal controller 21 is arranged to control the thermal output of the thermal elements 22 in dependence of a control signal, which may relate to the temperature of the micro lens array 1 or to a value of a detector signal that indicates the match of the electron beamlets 9 on a marker in the wafer plane.

Any type of temperature measurement unit 23 known from the prior art, capable of accurately measuring temperature, may measure the temperature of the micro lens array 1.

A detector for measuring the match of the electron beamlets on the converter elements 8 may be a conventional light optical system, for instance using markers on both the micro lens array and the converter.

Some embodiments of detector 24, using pattern detection, is depicted in FIG. 4 as I and II. In I, the detector 24 comprises an aperture 60 having at least two openings. The openings are for instance aligned with electron beamlets 15 when the adjustments means are in equilibrium state. Behind the aperture's holes, detectors 61 are located. By measuring the signals on the detectors and by comparing these signals, the distance between beamlets and the absolute position of the beamlets can be calculated. So in this embodiment, there is one opening and one detector for each beamlet.

In another embodiment of detector 24, shown in II, the aperture plate 60 has one opening located between electron beamlets, and again behind each hole one detector. Instead of these detectors, many other detectors for measuring the location of electron beamlets are possible.

It will be appreciated that the adaptive means 20 according to present invention may also be used when a mismatch between $D_L$ and $D_E$ occurs when during operation of the lithography system, the temperature of the micro lens array 1 or electron source 7 changes. Then, the adaptive means may (dynamically) correct the mismatch by adjusting one of the respective temperatures.

Also, it will be appreciated that adaptive means 20 according to the present invention may be applied together in a MAPPER system according to the present invention to provide adaptation of the dimensions of both the micro lens array 1 and the converter plate 7. In such a MAPPER system the micro lens array 1 may be heated and the converter plate 7 may be cooled, or vice versa. Advantageously, by joint operation of adaptive means 20 a change of temperature of micro lens array 1 and converter plate 7 can be smaller for a given matching of $D_L$ and $D_E$, in comparison with a MAPPER system, which would use only a single adaptive means 20.

Figure 5:
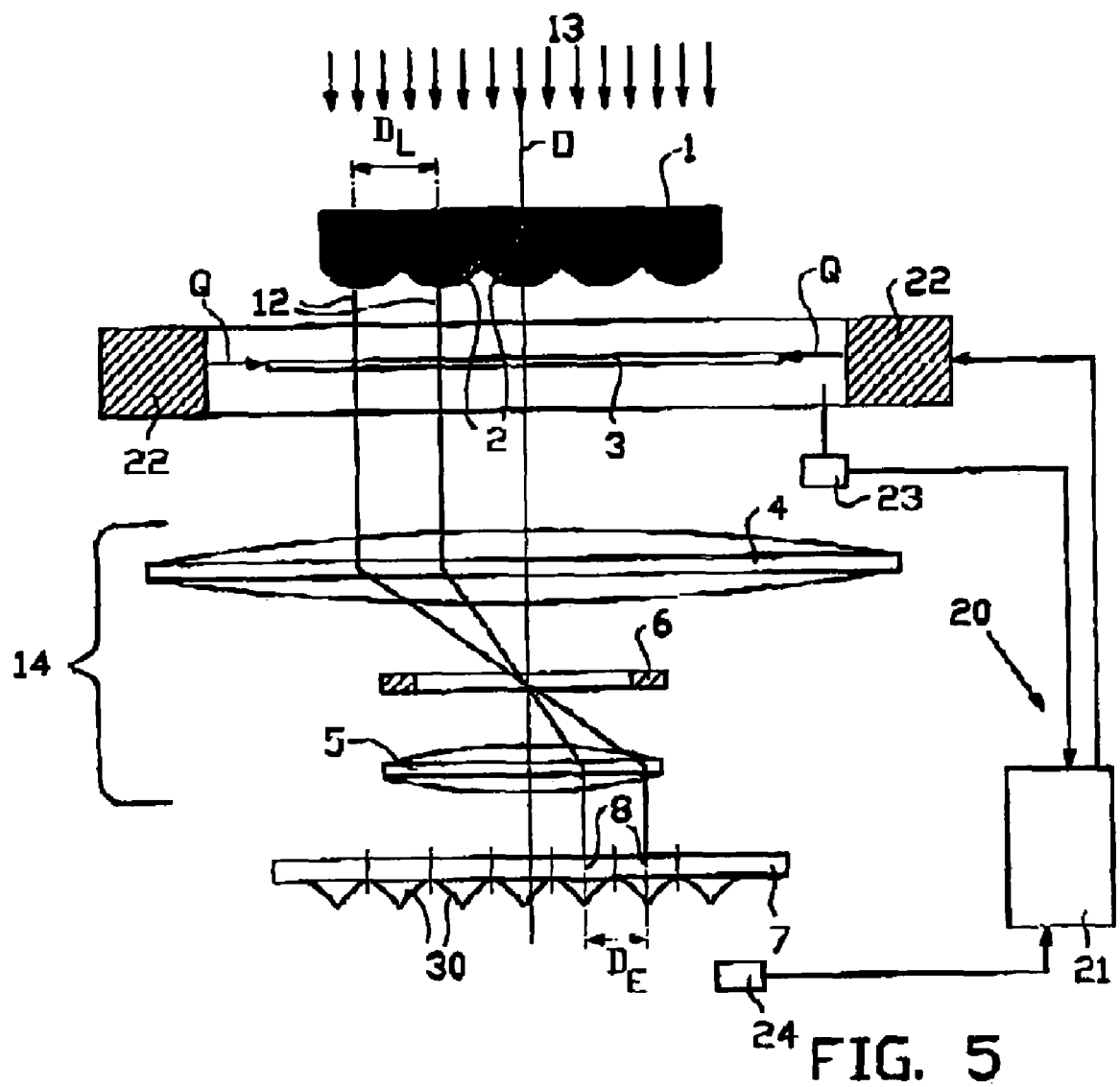
FIG. 5 shows schematically a third embodiment of a lithography system according to the present invention, which uses mask-related thermal means for adjustment of the mask.

In FIG. 5 a third embodiment of the present invention is shown. In this embodiment, the thermal means change the temperature of a mask when present in the lithography system. The system is further equal to the system of FIGS. 3 and 4.

Figure 6:
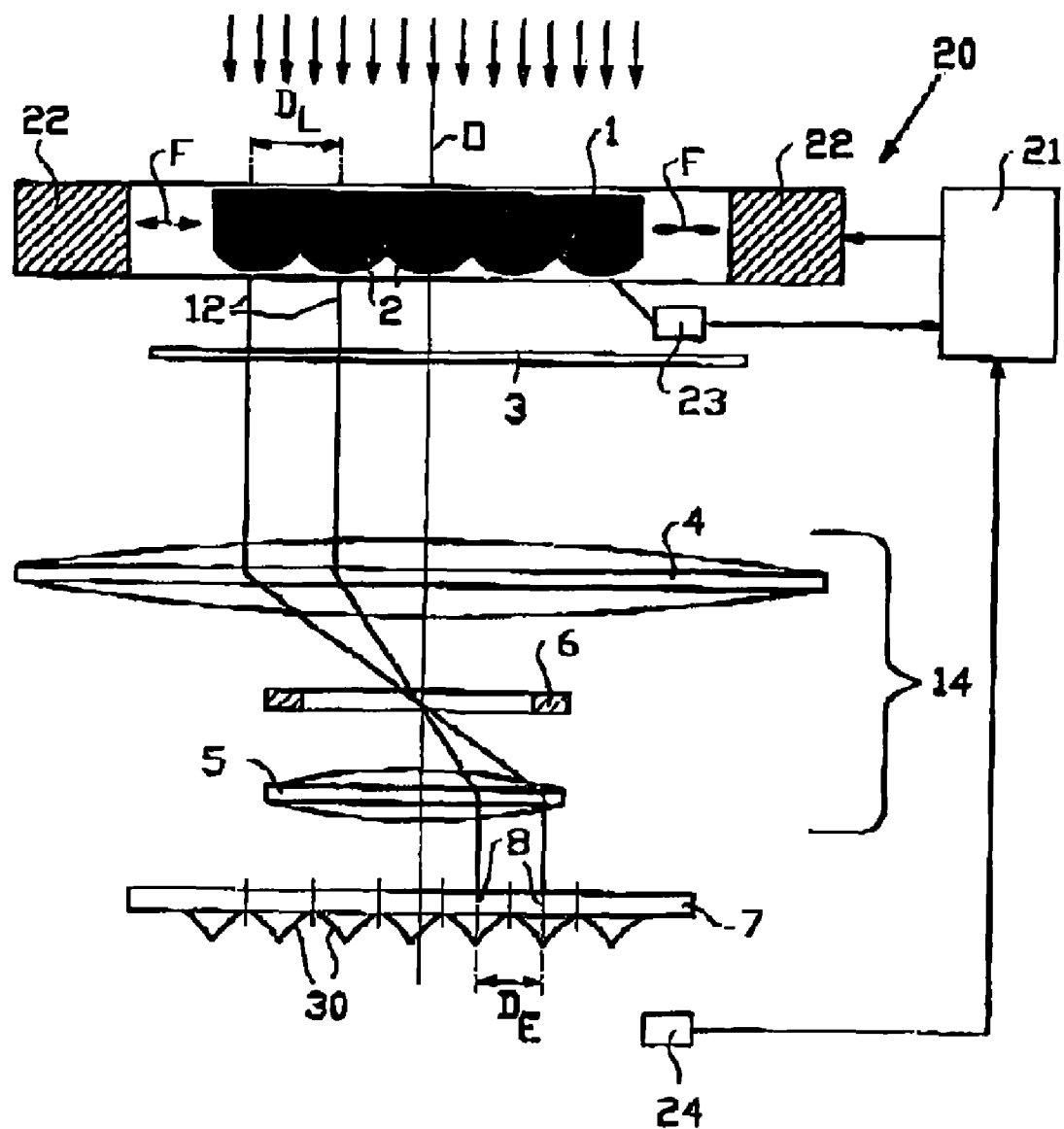
FIG. 6 shows an example of microlens-related mechanical means for adjusting the lithography system, working on the micro lens array.
Figure 7:
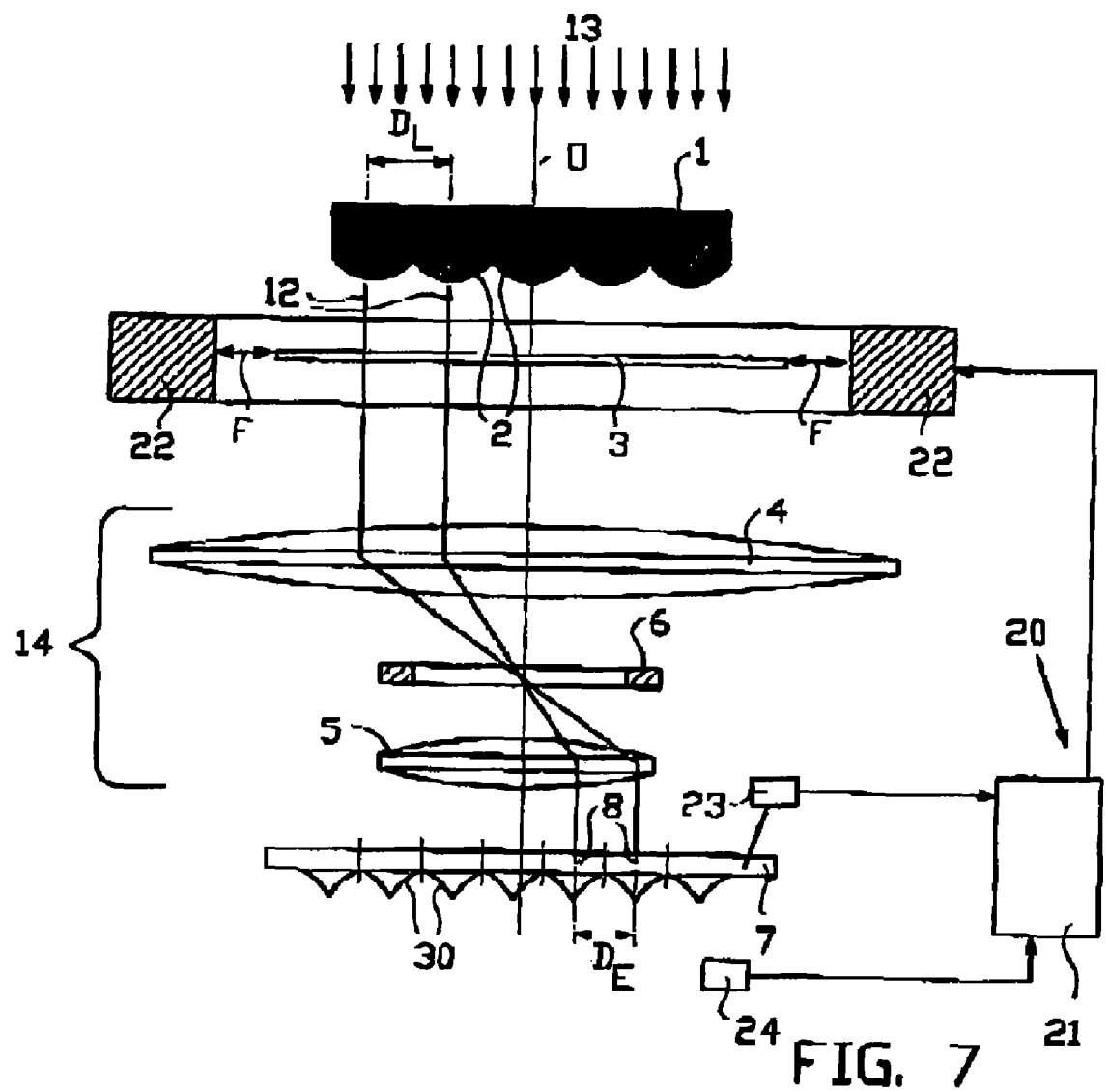
FIG. 7 shows an embodiment of the mask-related mechanical means, working on the mask.
Figure 8:
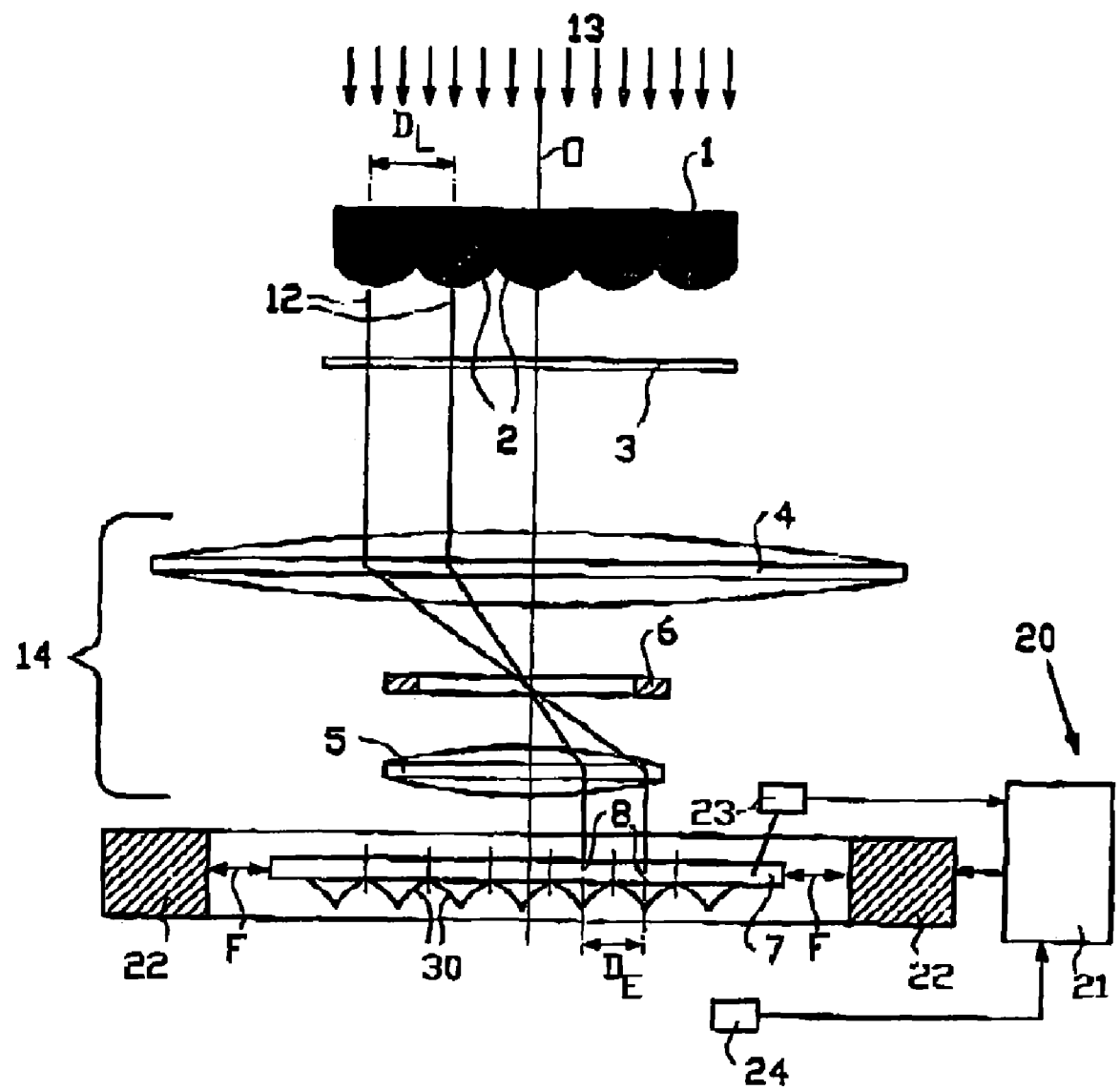
FIG. 8 shows an embodiment of the converter related mechanical means, working on the converter.

In a second main embodiment, various specific embodiments of which are shown if FIGS. 6–8, the control means comprise mechanical means for applying mechanical forces to various parts of the system. By applying mechanical forces, it also showed possible to adjust the physical dimensions of various main components of a MAPPER system. Again, identical reference numerals show identical components.

The basic layout of the embodiments shown in FIGS. 6–8 is identical. A detector 24 measures the deviation of a specific main component, like the micro lens array, the mask or the converter. A controller 21 compares the measured values with the desired values. The controller further comprises, in its memory, information regarding the response of that specific main component to alterations and/or specific settings or values of the mechanical means. Using a feedback loop, the controller checks changes made to the mechanical means, and their effect on the dimensions and the mutual alignment of the light beamlets and converter elements. If so desired, all these parameters can be inputted into a neural network running on a computer processor, which is part of the controller. Using the neural network, the adjustments can be calculated.

FIG. 6 shows the mechanical means working on the micro lens array. FIG. 7 shown the mechanical means working on the mask, and FIG. 8 shows the mechanical means working on the converter. In these embodiments, the mechanical means 22 only apply pressure and/or traction forces to the main components. It is also possible to add mechanical means for applying torsion forces, preferably in the plane of the main components, substantially perpendicular to the optical axis of the lithography system. In this way, not only the lens distance or element distance is changed, but also the pattern of the lenses or converter elements.

In an embodiment, shown in FIGS. 6–8, the forces are applied in the plane of the elements like the converter, micro lens array or mask. The forces compress or expand these elements in one direction, or the other direction, or both. In this way, it is possible to adjust the sizes in an X-direction, and/or an Y-direction. In the figures, only forces F in the Y-direction are shown (in FIG. 6, the X, Y and Z axes are indicated).

Figure 9:
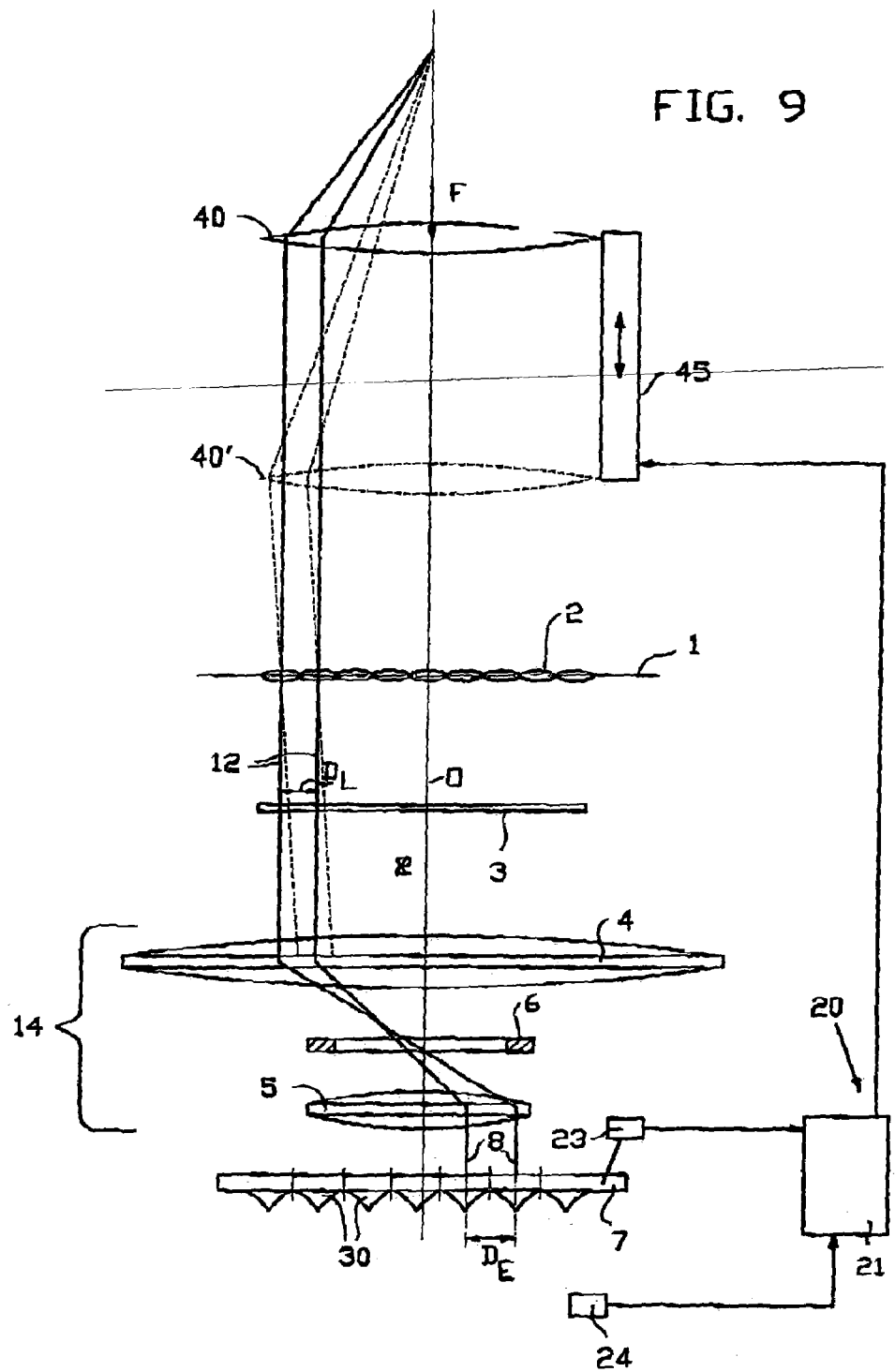
FIG. 9 shows optical means for adjusting the mutual position of the light beamlets and the converter elements.

A third main embodiment of the current invention uses optical means for adjusting the mutual positions of the light beamlets and the converter elements. This is shown in FIG. 9. Again, detector means 24 are connected to control means 21, and the control means are connected to the optical means 40 via actuator 45. In the embodiment shown in FIG. 9, a lens is placed before the micro lens array. This can also be a system of lenses. By moving the lens back and forth along the optical axis O of a MAPPER system, the angle α (with regard to the micro lens array) of each virtual ray of the light beam 13 is changed. In FIG. 9, numeral 40 depicts the lens in a first position, and numeral 40' with the lens in striped lines depicts the lens at a second position, causing the rays to impinge on micro lens array 1 at a different angle. In that way, the focal point of each beamlet leaving the microlens array is displaced in a direction substantially perpendicular to the optical axis of the lithography system. Thus is has proven to be possible to shift the position of the light beamlets very small distances.

Figure 9A:
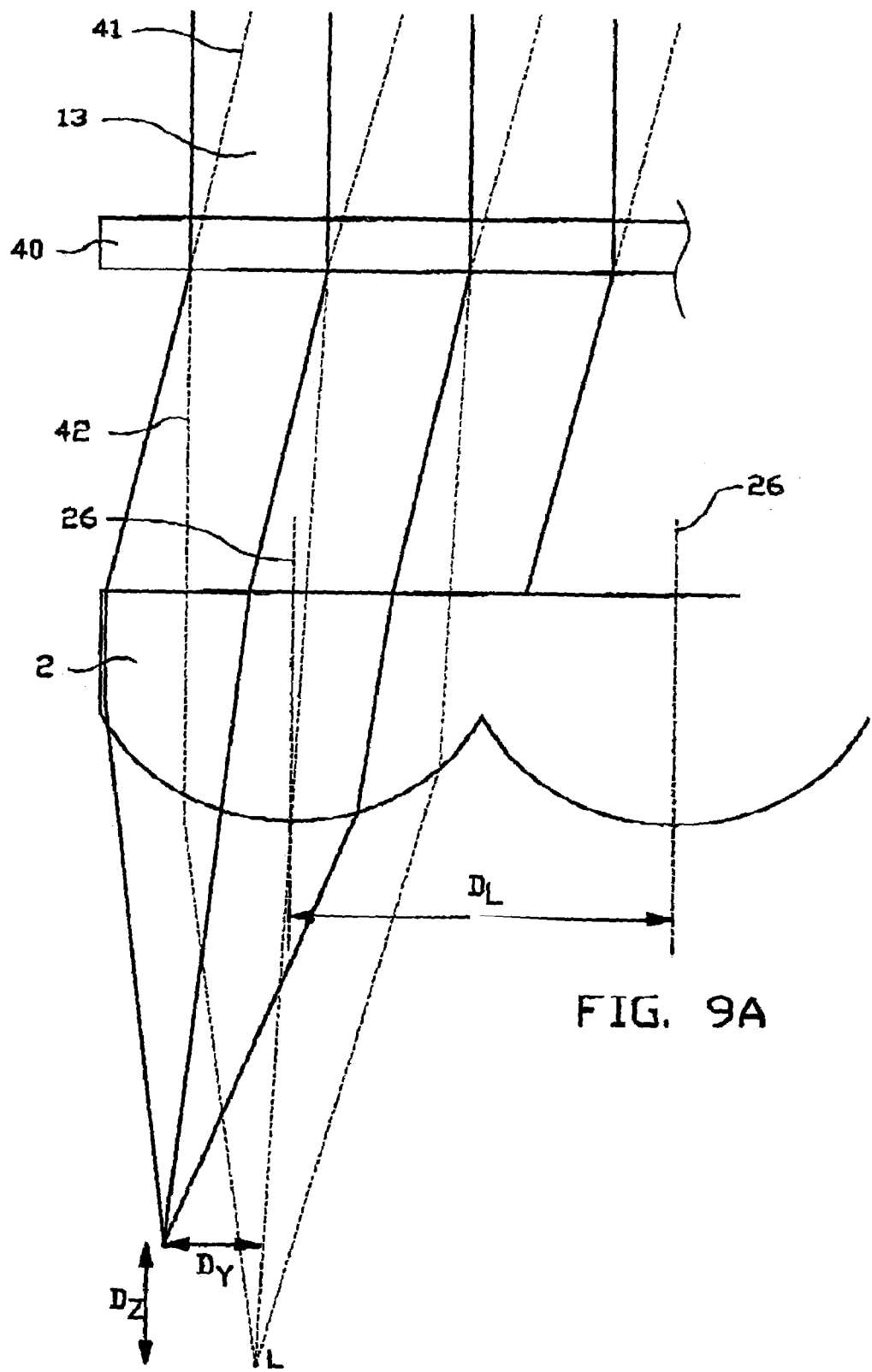
FIG. 9A shows a detail of FIG. 9.

In FIG. 9A, a detail of the lithography system is depicted, showing part of the micro lens array and part of the optical means, demonstrating the effect of the specific optical means described in FIG. 9. In the embodiment depicted, an element 40 having a virtual focal point is used. The striped lines 41 show the virtual light rays from light beam 13, coming from the virtual focal point. The striped lines 42 indicate the light rays from light beam 13 without element 40. This drawing thus clearly shows the effect of an element 40 having a virtual focal point: the focal point of the depicted light beamlet is shifted an amount $D_z$ downward and an amount $D_y$ to the right.

In another embodiment an adaptive mirror is used as optical means. In this way, the angle of each virtual light ray of the light beam can be changed.

Figure 10:
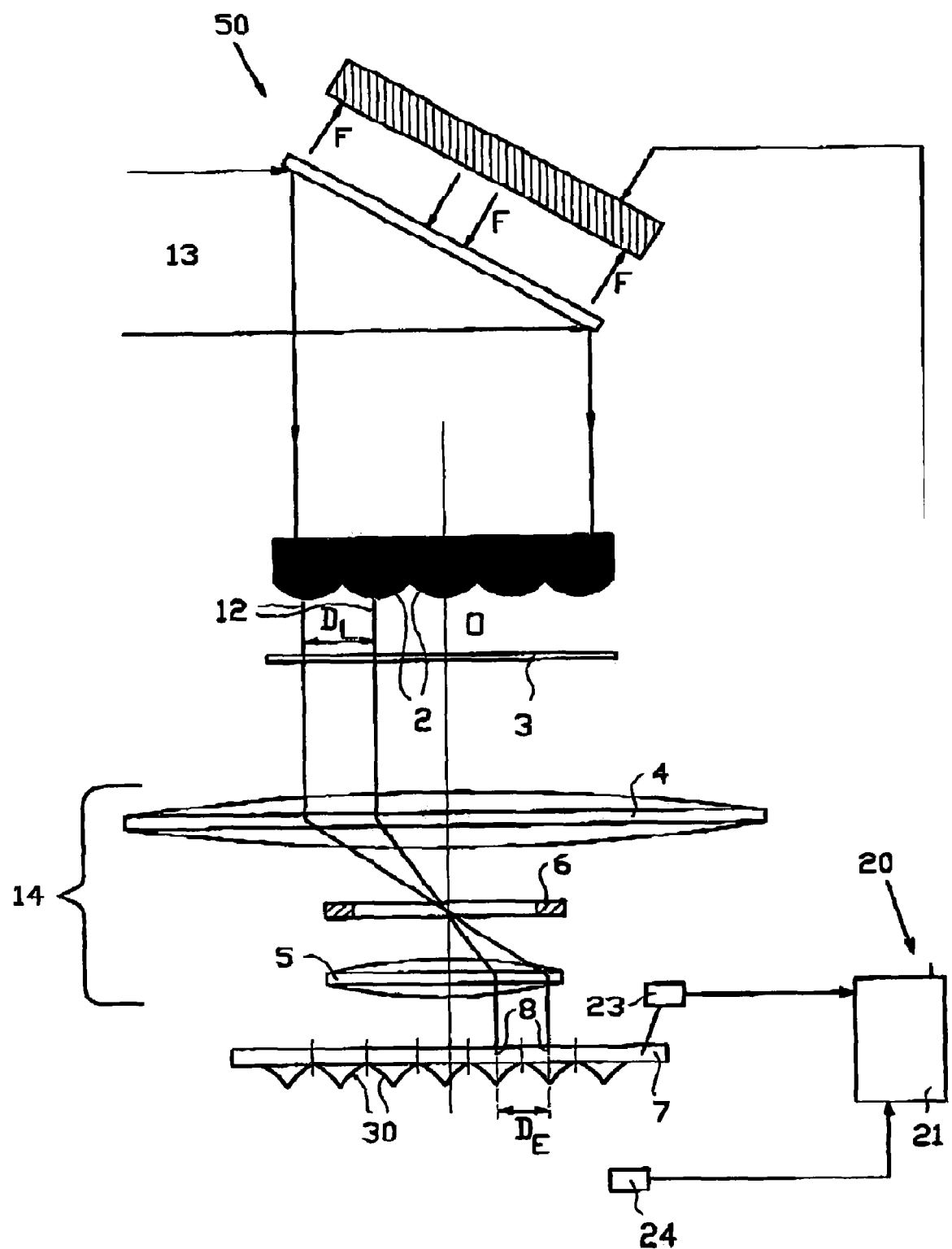
FIG. 10 shows optical means for adjusting, using adaptive optics.

In FIG. 10, an embodiment is shown using adaptive optics as adjustment means. In this embodiment shown, an adaptive mirror 50 is used. By changing the profile of the mirror using e.g. actuators exerting a force F on the reflective surface, the shape of the wavefront can be adapted. Especially, the profile of the wavefront can locally be changed. By changing the wavefront, the position of the light beamlets can be modified. Also, the position of the adaptive mirror 50 can be modified using actuator 45.

Figure 11:
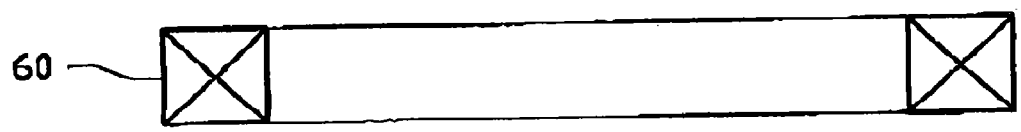
FIG. 11 shows means for adjusting using magnetic means causing a rotationally symmetric diverging magnetic field.
Figure 11:
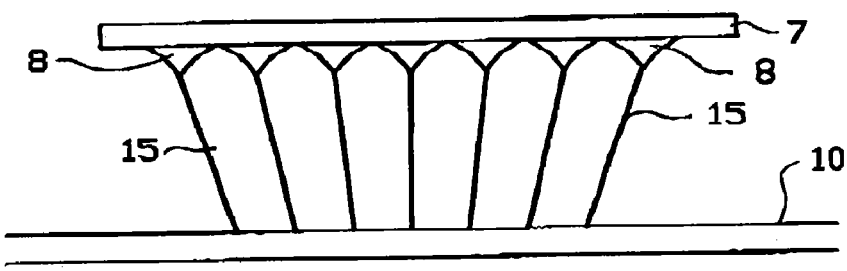
Figure 11:
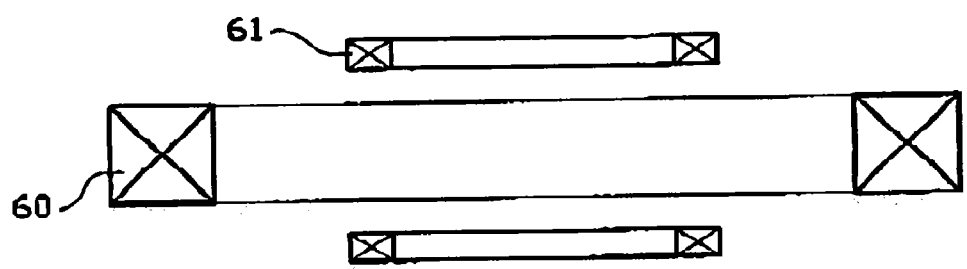
Figure 11:
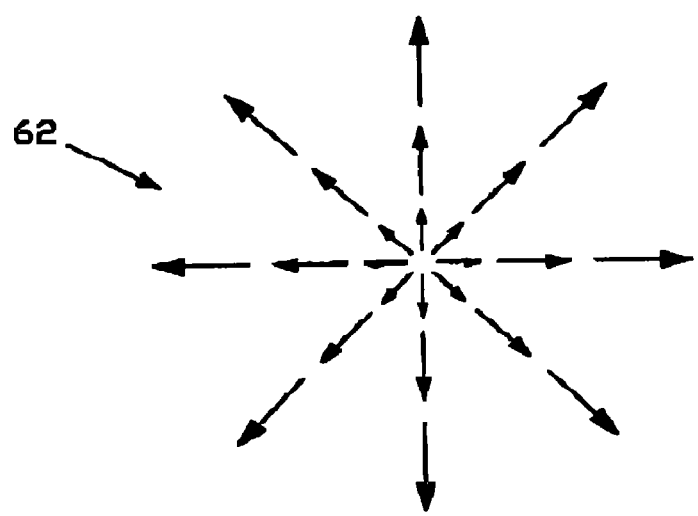
Figure 12:
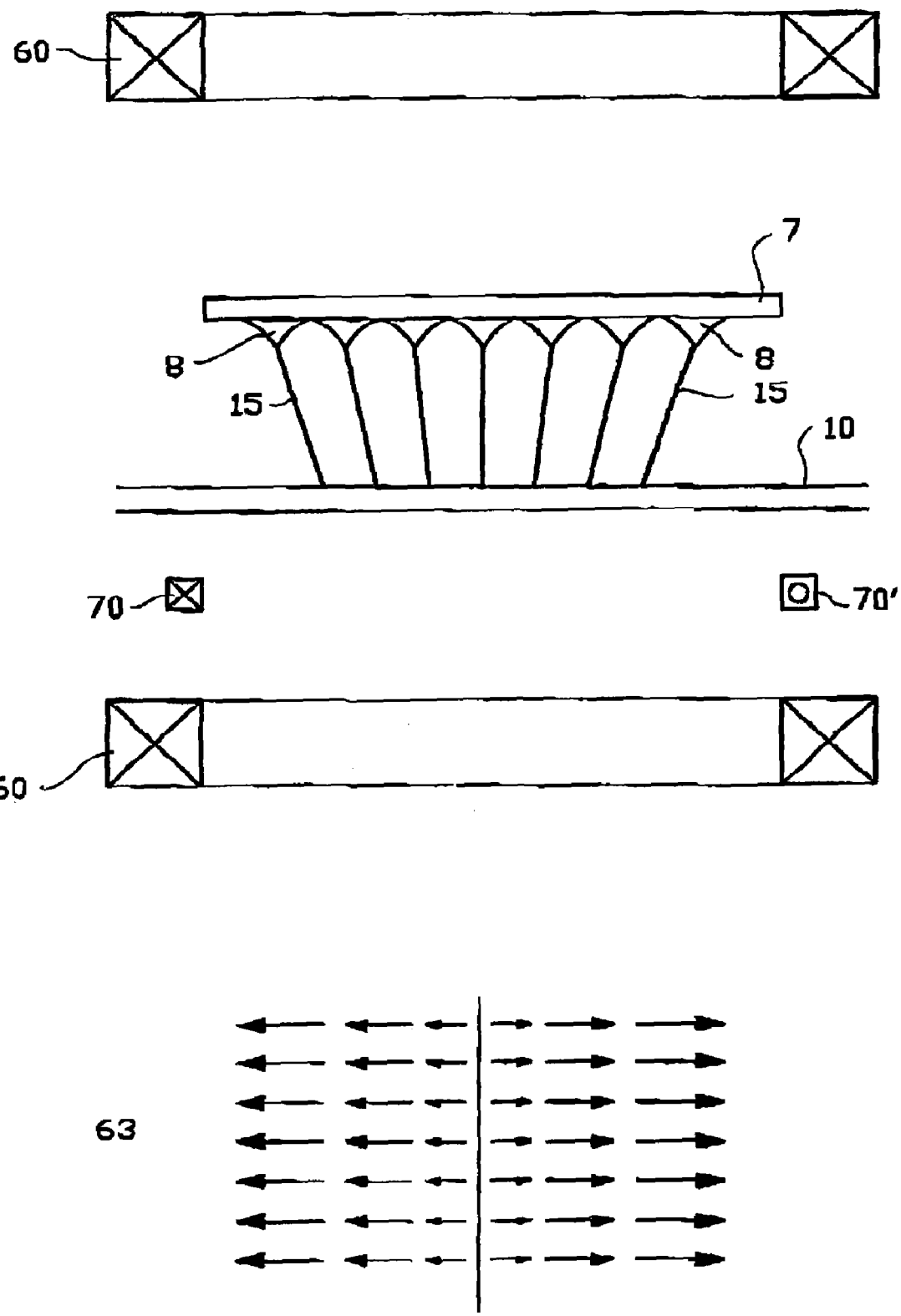
FIG. 12 shows means for adjusting using magnetic means causing a diverging magnetic field.
Figure 13:
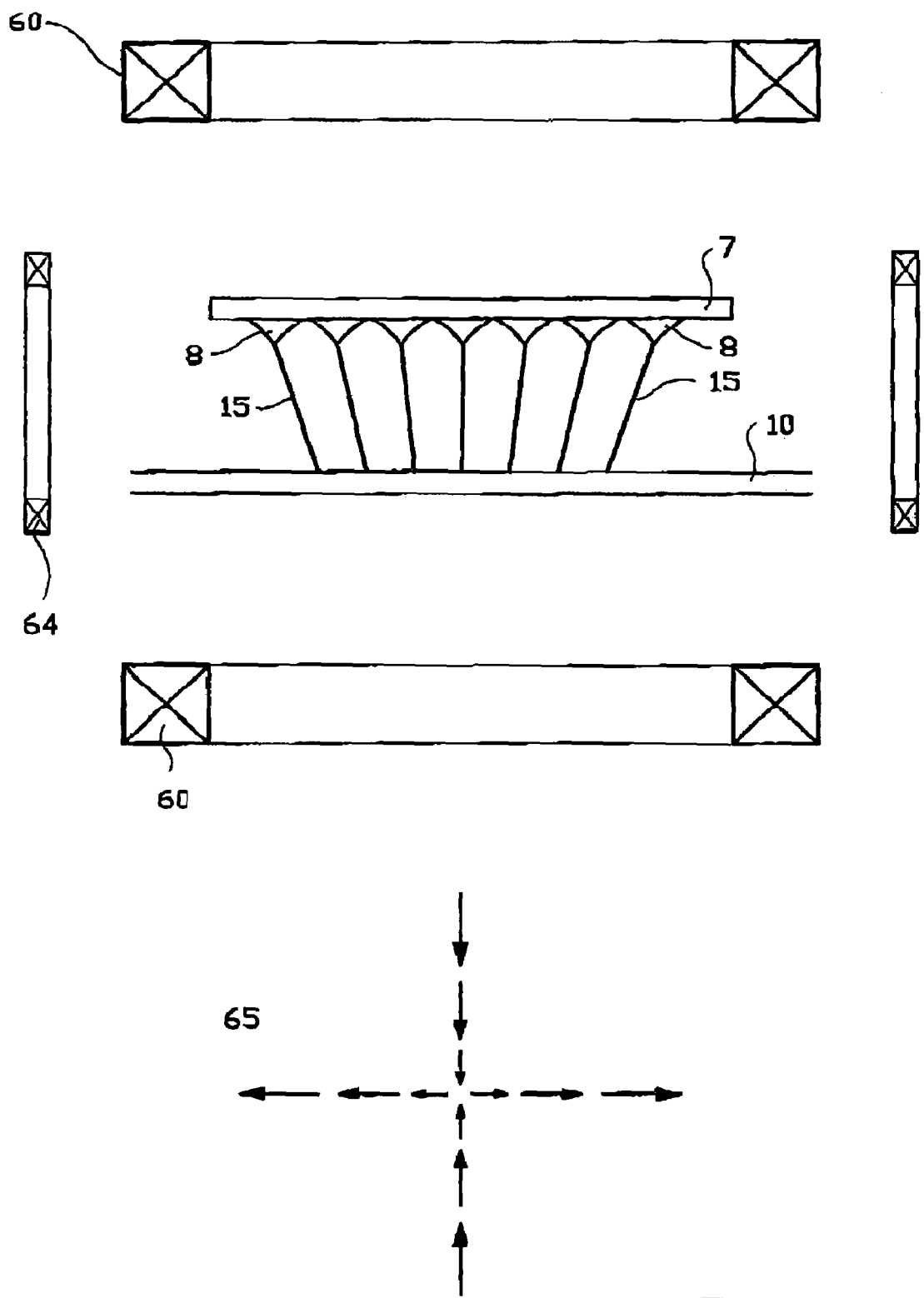
FIG. 13 shows means for adjusting using magnetic means causing a partly diverging partly converging magnetic field.

In FIGS. 11–13, several embodiments of the adjustment means are shown using magnetic means. In these embodiments, the control means control the form of the magnetic field, which directs the electron beams from the converter element to the wafer. In this way the distance between the electron focus positions on the wafer can be modified in a controlled manner. When the magnetic field between the converter plate and the wafer is perfectly homogeneous, the distance between the electron focus points is equal to the distance between the electron emission points on the converter plate. It was found at a later stage, that a small contraction or expansion can be obtained if one or more electrical current carrying coils are added which create a diverging or converging magnetic field.

In FIG. 11, main coils 60 are provided to create a homogeneous B field between the converter plate 7 and the object (wafer) 10. Additionally, smaller coils 61 are arranged around one of the main coils 60 to obtain a magnetic field between the converter plate and the wafer with a radial component proportional to the distance from the axis of the system. The vector field in FIG. 11, indicated with numeral 62, shows a top view of the actual magnetic field component in the X and Y direction (as defined in FIG. 3) The B-field is rotationally symmetric and diverging or converging. The same effect can be obtained by changing the current in the upper or lower coil 60 with respect to the other coil, or by displacing the coils along the optical axis O, thus moving the electron beamlets away from the centre of the coils 60.

Additional coils may be arranged to realise a magnetic field between the converter plate and the wafer having a radial component, which is proportional to the distance at the axis of the system to the power n, n being a natural number, for example 3. The distance between the electron focus positions is thus increased or decreased with respect to the distance between the electron emission points. The displacement of the electron focus positions with respect to the emission positions is then proportional to the distance from the axis of the system to the power n.

In FIG. 12, elongated current conducting lines 70, 70' are arranged for creating a magnetic field, which is proportional with the distance from the X-axis of the system. The field is symmetric in the X-axis. In this way, it is possible, by changing the strength of the magnetic field, to uniformly increase the distance between the electron focus points only in the X-direction. In an equivalent manner, the same effect can be obtained in the Y-direction. Again, a vector field 63 is shown to demonstrate the actual magnetic field component in the X and Y direction.

In FIG. 13, additional coils 64 are arranged. In these coils, the current runs in the same direction. In this way, a magnetic field between the converter plate and the wafer is realised having a radial component, which is proportional to the distance at the axis of the system to the power n, n being a natural number, for example 3. The distance between the electron focus positions is thus increased or decreased with respect to the distance between the electron emission points. The displacement of the electron focus positions with respect to the emission positions is then proportional to the distance from the axis of the system to the power n.

It is also possible to run currents through the converter plate or conductors or conducting layers on the converter plate and through the substrate or layers on the substrate. In this way, a magnetic field component between the substrate and the converter plate and directed more or less in a plane parallel to these planes can be established. In this way, no additional coils are needed.

In a further embodiment, the above-mentioned magnetic means may be combined. The magnetic means can also be combined with the other adjustment means described above.

Specifically, there are several specific modifications of the magnetic field which can be used:

| | |
|---|---|
| M$_{overall}$ | Δr(:)r |
| M$_x$ | Δx(:)x, Δy = 0 |
| M$_y$ | Δy(:)y, Δx = 0 |
| M$_x$, M$_y$ | Δx(:)x, Δy(:) − y |
| Distortion | Δr(:)r$^3$ |
| Spiral distortion | Δφ(:)r$^3$ |

Instead of a lens, it is also possible to use means for changing the phase of (parts of) the light beam. This can for instance be done using an liquid crystal layer between transparent electrodes, much like a liquid crystal display (LCD), but without the polarizers, and other elements.

FIG. 14 shows an embodiment of the maskless MAPPER system. Each individually controllable light source comprises an optical fiber 46, having a first end directed to a converter element 8 and a second end arranged for receiving light. Between the first end and the converter plate 7 an optical assembly focuses the light coming out of one optical fiber 46. Preferably the optical assembly comprises a plurality of microlenses 43 thus forming a microlens array. Preferably the microlens 43 is positioned at the tip of each fiber. In this specific embodiment the light coming out of the optical fiber 46 is not directly focused on the activation area 47 of the converter element 8. It is however possible to focus the emitted light directly on the converter plate 7. The microlenses 43 first focus each light beam from an optical fiber 46 in a small spot of typically 200–2000 nm in the plane 45. The plane 45 is subsequently projected, using demagnifier 44, onto the converter plate 7. The demagnifier can be a 1:1 projector, or may be capable of projecting at a reduced size, for instance 1:4.

In FIG. 14, furthermore, an aperture plate 40 and electrostatic deflection strips 41 are shown. The electrostatic deflection strips 41 are connected to a power source 42. In this embodiment, the scanning of beamlets is performed by electrostatic means. The electrons are first accelerated towards aperture plate 40. In the second part of their trajectory, after passing the aperture plate 40, the electron beamlets are deflected by strips 41, which carry voltages, alternatively positive and negative. The combination of a focussing magnetic field (not shown) and an electrostatic field deflects the electrons in a direction perpendicular to both magnetic and electrostatic field.

It can be easily understood that the same kind of alignment problems occur with respect to the micro lens array and the converter plate as discussed and shown before regarding the mask-based MAPPER system.

The different embodiments shown can also be combined. In that way, especially when using an intelligent controller, it can be possible by controlling the temperature of all the components and by applying mechanical forces to various components and manipulating various optical means, to fully align the lithography system, and even to adjust the alignment dynamically. Using fuzzy logic or neural networks or other techniques known to a man skilled in the art, it is thus possible to dynamically align the system, and keep it aligned during various operating conditions. In the controller in such an embodiment, positional data regarding the light beamlets and other measured parameters would be fed to the controller by a feedback loop.

It is to be understood that the above description is included to illustrate the operation of the preferred embodiments and is not meant to limit the scope of the invention. The scope of the invention is to be limited only by the following claims. From the above discussion, many variations will be apparent to one skilled in the art that would yet be encompassed by the spirit and scope of the present invention.

I claim:

1. A lithography system comprising:
   means for generating a plurality of light beamlets;
   an electron source, arranged to be illuminated by said light beamlets, said electron source comprising a plurality of converter elements at an element distance from each other for converting a light beamlet impinging onto it into an electron beamlet directed towards and focused on an object plane, and
   control means for matching the mutual positions of the light beamlets with respect to the mutual positions of the electron beamlets.

2. The lithography system of claim 1, wherein the control means for manipulating the mutual positions of the light beamlets and the electron beamlets comprise converter adaptive means for actively adapting the distance between at least two electron beamlets of the converter.

3. The lithography system of claim 2, wherein the converter adaptive means comprise means for adapting the physical properties of the converter.

4. The lithography system of claim 3, said means for adapting the physical properties of the converter comprising means for changing the element distance between at least two elements.

5. The lithography system of claim 4, wherein the means for changing the element distance comprise converter-related thermal means for changing the temperature of the converter.

6. The lithography system of claim 5, wherein said converter-related thermal means are adapted to change the temperature of the converter.

7. The lithography system of claim 6, wherein said converter-related thermal means are adapted to change the temperature of the converter either uniformly or according to a predetermined temperature profile.

8. The lithography system of claim 4, wherein the means for changing the element distance comprise converter-related mechanical means for applying mechanical forces to the converter.

9. The lithography system of claim 8, wherein said converter-related mechanical means comprise means for applying the forces either uniformly or according to a predetermined profile.

10. The lithography system of claim 8, wherein the mechanical forces are selected from the group consisting of either pressure forces, tension forces, torsion forces, and a combination of any one of these three forces.

11. The lithography system of claim 1, wherein said means for generating a plurality of light beamlets comprise:
    at least one light source for generating a light beam, and
    a micro lens array, arranged in the light path of said light source between said light source and said electron source, and comprising a plurality of lenses at a lens distance from each other, said plurality of lenses being arranged for forming said plurality of light beamlets, and for focussing said focusing said plurality of light beamlets onto said electron source.

12. The lithography system of claim 11, wherein the said at least one light source is individually controllable.

13. The lithography system of claim 11, wherein the control means comprise micro lens adaptive means for actively adapting the positions of focal points of at least one micro lens of the micro lens array.

14. The lithography system of claim 13, wherein the micro lens adaptive means comprise means for adapting the physical properties of the micro lens array.

15. The lithography system of claim 14, wherein the means for adapting the physical properties of the micro lens array comprises means for changing the lens distances.

16. The lithography system of claim 15, wherein the means for changing the lens distance comprises microlens-related thermal means for changing the temperature of the micro lens array.

17. The lithography system of claim 16, wherein the microlens-related thermal means are adapted to change the temperature of the micro lens array either uniformly or according to a predetermined temperature profile.

18. The lithography system of claim 15, wherein the means for changing the lens distance comprises microlens-related mechanical means for applying mechanical forces to the micro lens array.

19. The lithography system of claim 18, wherein said microlens-related mechanical means comprise means for applying the forces either uniformly or according to a predetermined profile.

20. The lithography system of claim 18, wherein the mechanical forces are either pressure forces, tension forces, torsion forces or a combination of any one of these three forces.

21. The lithography system of claim 15, wherein the control means comprise adaptive means for substantially matching said lens distance with said element distance by either expansion or contraction of at least one of said micro lens array and said electron source.

22. The lithography system of claim 21, wherein said adaptive means comprise microlens-related thermal means for modifying said lens distance by either thermal expansion or contraction of said micro lens array.

23. The lithography system of claim 22, wherein said microlens-related thermal means comprise microlens-related thermal elements, and a microlens-related thermal controller.

24. The lithography system of claim 22, wherein said microlens-related thermal means are arranged to generate a microlens-related heat flow to or from said micro lens array.

25. The lithography system of claim 24, wherein said microlens-related thermal means are arranged to control said microlens-related heat flow in dependence of a microlens-related control signal relating to the temperature of said micro lens array.

26. The lithography system of claim 25, wherein said control signal is generated by a microlens-related temperature sensor for sensing the temperature.

27. The lithography system of claim 25, wherein said control signal is related to a value of a detector signal generated by a microlens-related detector for indicating the match of said lens distance and said element distance.

28. The lithography system of claim 11, wherein the control means comprise adaptive means for substantially matching said lens distance with said element distance by either expansion or contraction of at least one of said micro lens array and said electron source.

29. The lithography system of claim 28, wherein said adaptive means comprise converter-related thermal means for modifying said element distance by either thermal expansion or contraction of said electron source.

30. The lithography system of claim 29, wherein said converter-related thermal means comprise converter-related thermal elements and a converter-related thermal controller.

31. The lithography system of claim 30, wherein said converter-related thermal elements are arranged to generate a converter-related heat flow to or from said electron source.

32. The lithography system of claim 31, wherein the converter-related thermal controller is arranged to control said converter-related heat flow in dependence of a converter-related control signal relating to the temperature of said electron source.

33. The lithography system of claims 32, wherein the converter-related control signal is generated by a converter-related temperature sensor for sensing the temperature.

34. The lithography system of claim 33, wherein said control signal is related to a value of a detector signal generated by a converter-related detector for indicating the match of said lens distance and said element distance.

35. The lithography system of claim 11, comprising first optical means for modifying the light from said at least one light source illuminating the micro lens array.

36. The lithography system of claim 35, wherein said first optical means comprises a lens or system of lenses, for modifying the true or virtual focal point of the light from the light source.

37. The lithography system of claim 35, wherein said first optical means comprise liquid crystal means for adaptively modifying the phase of the light from the light source.

38. The lithography system of claim 37, wherein the modification of the phase is performed locally in a plane parallel to the micro lens array.

39. The lithography system of claim 11, wherein the control means comprise adaptive means for substantially matching said lens distance with said element distance by either expansion or contraction of at least one of said micro lens array and said electron source.

40. The lithography system of claim 39, wherein said adaptive means comprise mechanical means for applying mechanical forces to at least one of said micro lens array and said electron source for expanding or contracting of one of said micro lens array and said electron source.

41. The lithography system of claim 11, wherein the control means comprise adaptive means for substantially matching said lens distance with said element distance by either expansion or contraction of at least one of said micro lens array and said electron source.

42. The lithography system of claim 41, wherein said adaptive means comprise optical means.

43. The lithography system of claim 42, wherein said optical means comprise phase shift gradient means.

44. The lithography system of claim 42, wherein said phase shift gradient means comprise an LC-screen placed before or after the micro lens array.

45. The lithography system of claim 42, wherein said optical means comprise a refractive lens before the micro lens array.

46. The lithography system of claim 41, wherein said adaptive means further comprise means for displacing said refractive lens along the optical axis.

47. The lithography system of claim 1, wherein said lithography system further comprises
 a mask comprising an image, and said light beamlet from each of said plurality of lenses is being focused on said mask
 an optical system being arranged for projecting said image on said electron source by said light beamlets of each of said plurality of lenses.

48. The lithography system of claim 47, further comprising mask-holding means for holding a mask between the micro lens array and the electron source, wherein said control means comprise mask adaptive means for actively adapting the working parameters of the mask.

49. The lithography system of claim 48, wherein the mask adaptive means comprise means for adapting the mutual distances of at least two features on the mask.

50. The lithography system of claim 48, wherein the mask adaptive means comprise mask-related thermal means for changing the temperature of the mask wherein said mask-related thermal means are adapted to change the temperature of the mask either uniformly or according to a predetermined temperature profile.

51. The lithography system of claim 48, wherein the mask adaptive means comprise mask-related mechanical means for applying mechanical forces to the mask, wherein said mask-related mechanical means comprise means for applying the forces either uniformly or according to a predetermined profile and wherein the mechanical forces are either pressure forces, tension forces, torsion forces or a combination of any one of these three forces.

52. The lithography system according to claim 1, wherein the control means comprise:
   measuring means for measuring the actual positions of at least one selected from the light beamlets and the electron beamlets;
   a comparator for comparing the actual positions of at least one selected from the light beamlets and the electron beamlets with desired positions;
   a processor for calculating a target setting of the positions, based on the comparisons of the comparator;
   a controlling element for adapting at least one of the working parameters of at least one of the micro lens array, the mask and the converter until the desired positions are reached.

53. The lithography system according to claim 1, wherein the control means comprise magnetic means for actively adapting the positions of electron beamlets in the object plane.

54. The lithography system of claim 53, wherein the magnetic means comprises at least one magnetic field generator for modifying the magnetic field between the electron source and the object plane.

55. The lithography system of claim 54, said magnetic field generator applies a continuously varying magnetic field with a non-uniform magnetic field component.

56. The lithography system of claim 55, wherein said magnetic field generator is adapted for creating a dipole or quadrupole field between the electron source and the object plane.

57. The lithography system of claims 54, said magnetic field having a field strength that is increasing uniformly in at least one direction in a plane parallel to the object plane and furthermore increasing with the distance from the optical axis of the lithography system, especially when said magnetic field component is the radial component.

58. A method for processing a substrate comprising:
   generating a plurality of light beamlets;
   illuminating an electron source by said light beamlets;
   converting each light beamlet impinging on said electron source into an electron beamlet directed towards and focused on an object plane; and
   matching the mutual positions of the light beamlets with respect to the mutual positions of the electron beamlets.

* * * * *

UNITED STATES PATENT AND TRADEMARK OFFICE
CERTIFICATE OF CORRECTION

| | | |
|---|---|---|
| PATENT NO. | : 7,019,312 B2 | Page 1 of 1 |
| APPLICATION NO. | : 10/600953 | |
| DATED | : March 28, 2006 | |
| INVENTOR(S) | : Kruit | |

It is certified that error appears in the above-identified patent and that said Letters Patent is hereby corrected as shown below:

Title Page, In Item [56], U.S. Patent Documents, please insert -- 6014203    1/2000 Ohkawa --.

Col. 18, Line 44, In Claim #42, please delete "claim 42" and insert -- claim 41 --.

Signed and Sealed this

First Day of May, 2007

JON W. DUDAS
*Director of the United States Patent and Trademark Office*